United States Patent
Ya (12)

(10) Patent No.: US 7,167,368 B2
(45) Date of Patent: Jan. 23, 2007

(54) ELECTRONIC EQUIPMENT CASE STRUCTURE

(75) Inventor: Yun-Jie Ya, Taipei (TW)

(73) Assignee: Inventec Corporation, Taipei (TW)

( * ) Notice: Subject to any disclaimer, the term of this patent is extended or adjusted under 35 U.S.C. 154(b) by 138 days.

(21) Appl. No.: 11/094,283

(22) Filed: Mar. 31, 2005

(65) Prior Publication Data

US 2006/0221575 A1    Oct. 5, 2006

(51) Int. Cl.
*H05K 7/20*    (2006.01)

(52) U.S. Cl. ............... 361/707; 361/685; 361/716; 361/679; 165/80.3; 165/121; 312/223.2; 360/97.02

(58) Field of Classification Search ............ 361/687, 361/685, 690, 696, 695, 717–721, 704, 707, 361/727; 165/80.3, 122, 185; 174/16.3; 360/97.01, 97.02; 454/186; 312/223.2
See application file for complete search history.

(56) References Cited

U.S. PATENT DOCUMENTS 5,927,386 A * 7/1999 Lin ..................... 165/80.3
6,141,211 A * 10/2000 Strickler et al. ............ 361/685
6,532,141 B1   3/2003 Wu
6,741,466 B1 * 5/2004 Lebo ..................... 361/687
6,854,174 B1 * 2/2005 Jiang ................... 29/603.1
6,937,469 B1 * 8/2005 Muennich ............. 361/690
7,068,506 B1 * 6/2006 Behl ..................... 361/695

FOREIGN PATENT DOCUMENTS

GB    2 145 290 A  *  3/1985
TW    585303 U    11/1990

* cited by examiner

*Primary Examiner*—Michael Datskovsky
(74) *Attorney, Agent, or Firm*—Birch, Stewart, Kolasch & Birch, LLP

(57) ABSTRACT

An electronic equipment case structure aims to provide bracing and cooling for an electronic element. The electronic equipment is housed in the case which has a plurality of protrusive sections on the outer side that are spaced from one another at a selected distance to serve as a bracing structure. By means of using material of a high thermal conductive coefficient and increasing the radiation area, cooling efficiency increases. The electronic equipment case structure can provide a bracing and cooling function.

16 Claims, 5 Drawing Sheets

ELECTRONIC EQUIPMENT CASE STRUCTURE

FIELD OF THE INVENTION

The present invention relates to a case structure and particularly to a case for holding electronic equipment to provide support and cooling.

BACKGROUND OF THE INVENTION

In the design of a computer system, cooling is an important issue. Every electronic element will generate heat during operation. If the heat is not dispelled, the element will malfunction or even be damaged. Hence cooling is necessary. The most common approach to dispel heat is to couple the heating element with a thermal conductive element. The thermal conductive element aims to enlarge the cooling area of the heating element so that cooling efficiency may increase. For instance, U.S. Pat. No. 6,532,141 discloses an electronic element cooling structure, referring to FIG. 1 of that patent application. It has a body containing a plurality of coupling sections. Each coupling section has screw threads. The body further has a thermal conductive duct running through the center of the coupling section and extending outside. A radiator is provided that has a plurality of annular radiation fins on the outer surface. The radiator has two ends aligned in the axial direction. One end has internal screw treads. The other end is connected to a connecting section, which has external screw threads. The internal screw threads of the radiator may be fastened to the external screw threads of the coupling section to form a connection. The coupling section has a thermal conductive duct extended therefrom. The radiator has a hole in the center to receive the thermal conductive duct. Several radiators may be connected consecutively to increase the cooling efficiency.

R.O.C. patent publication No. 585303 also discloses an improved radiation blade for computers, referring to FIGS. 4 and 5 of that patent application. It is a composite radiation blade. Each radiation blade has a unit body with a latch structure. Hence the unit body may be coupled to form a set of stacking radiation blades. Each stacking unit body is spaced from a neighboring unit body by an air gap to provide a ventilation channel for cooling.

The cooling structure of the aforesaid reference No. 141 mainly is connected to an electronic element that generates a great amount of heat. It provides a large cooling area and an improved thermal conduction structure, but is not a bracing structure. The cited reference of No. 303 aims to couple a number of unit bodies through the latch structure to form a composite radiation blade. The unit bodies are stacked to increase the cooling area. However, the latch structure can only couple the unit body in an upright manner, not in a paired and juxtaposed manner. While it provides cooling and a limited support, the unit bodies are not coupled securely, and are prone to loosen and tumble. This could cause trouble. Moreover, the latch structure cannot increase the cooling area very much, and the improvement of the cooling efficiency is limited.

SUMMARY OF THE INVENTION

In view of the aforesaid problems, the primary object of the present invention is to provide an electronic equipment case structure to hold an electronic equipment and to provide bracing and cooling effect when housed in a computer case.

To achieve the foregoing object, the case structure according to the invention includes a shell and a blade-cooling portion mounted onto the outer surface of the shell. The blade-cooling portion has a plurality of protrusive sections that are spaced from one another at a selected distance. The blade-cooling portion may be formed in varying styles. Besides having the protrusive sections on the surface, the blade cooling portion may also have a plurality of bosses to cover the entire surface that have a cross section of a square or an arched shape to increase the surface area. The bottom side and topside of the blade-cooling portion are not covered by the bosses and are flat and smooth surfaces to provide a tight coupling with the elements. A cooling recess may be formed between two neighboring protrusive sections. The cooling recess also has a plurality of sub-protrusive sections, which also have a cross section of a square or an arched shape to increase the surface area.

The electronic equipment is housed in the electronic equipment case. When the electronic equipment is in use, it generates heat. The case is made of material of a higher thermal conductive coefficient such as aluminum, copper, silver or steel to transfer the heat to the blade-cooling portion. The blade-cooling portion has a greater amount of radiation area to increase the cooling efficiency. In addition, the case and the contact elements are spaced from each other at a selected distance and can provide a bracing effect. The protrusive sections provide the bracing effect. The bottom side of the blade-cooling portion is in contact with the surface of the shell. The cooling recess that has the sub-protrusive sections and sub-recesses is not connected to any element. To improve the cooling effect, the shell and the blade-cooling portion are made of material of a higher thermal conductive coefficient. In addition, the blade-cooling portion also has bosses or sub-protrusive sections formed on the surface to increase the surface area. Therefore the total radiation area increases and the cooling efficiency is enhanced.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
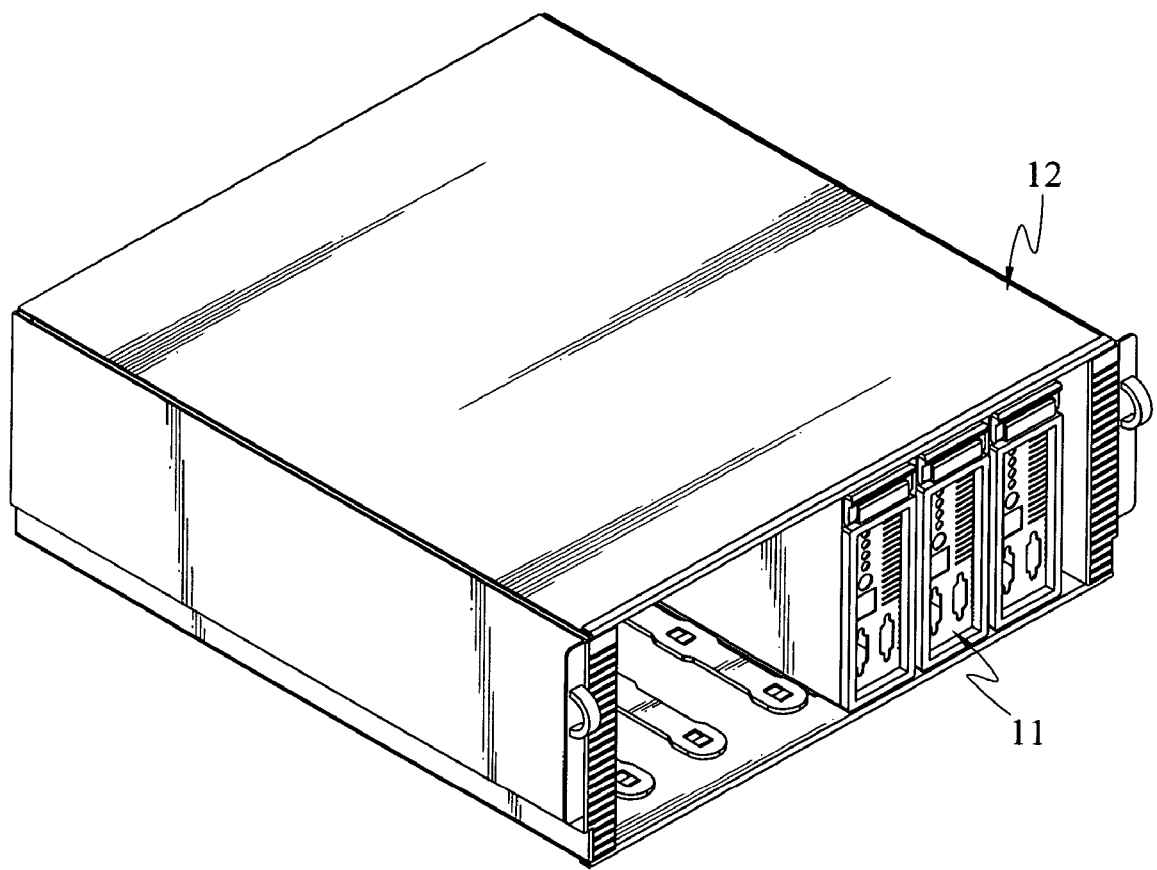
FIG. 1 is a schematic view of conventional elements in an installed condition.
Figure 2:
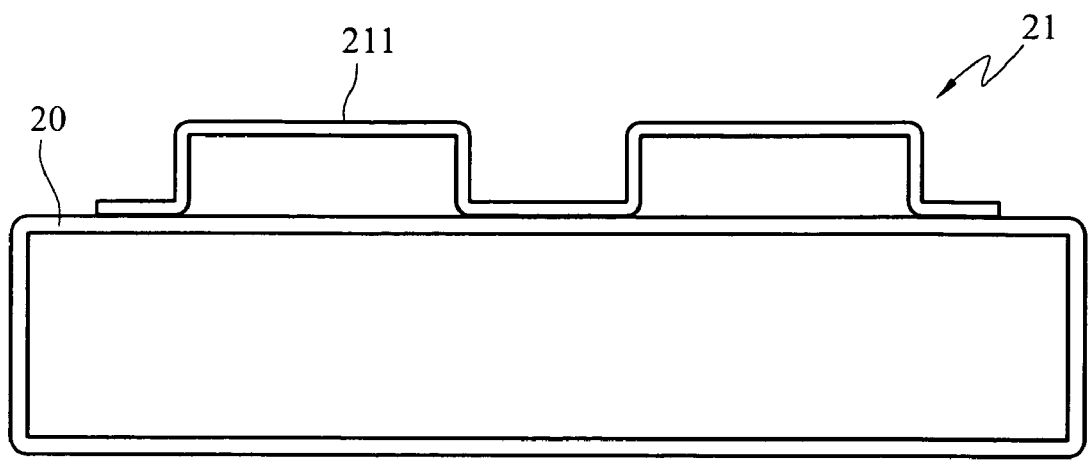
FIG. 2 is a schematic view of the invention.

Referring to FIG. 2, the electronic equipment case structure according to the invention includes a shell 20 and a blade-cooling portion 21. The shell 20 is hollow and has a housing compartment to hold electronic equipment. The blade cooling portion 21 includes a plurality of protrusive sections 211 that are spaced from one another at a selected distance to form a zigzag profile, to brace other elements that are in contact with the case, to provide support and partition.

Figure 3:
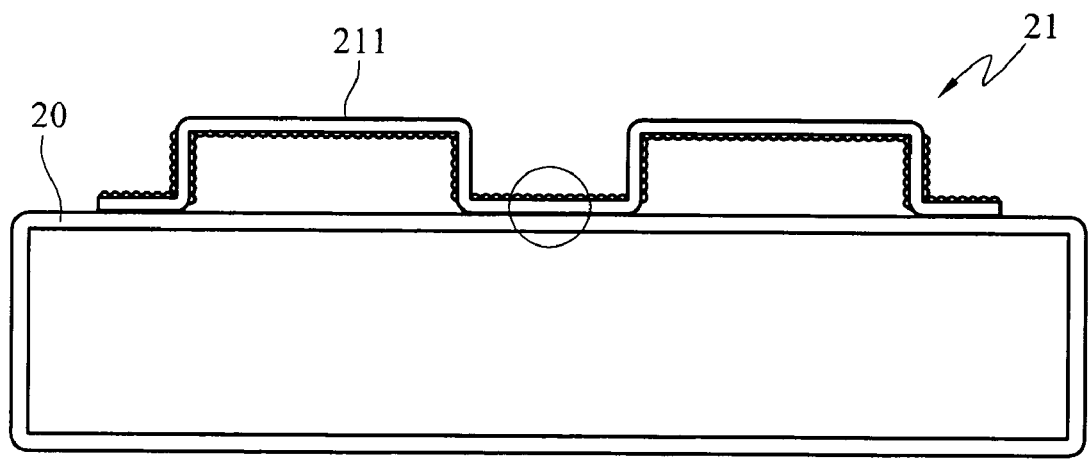
FIG. 3 is a schematic view of a second embodiment of the invention.
Figure 4A:
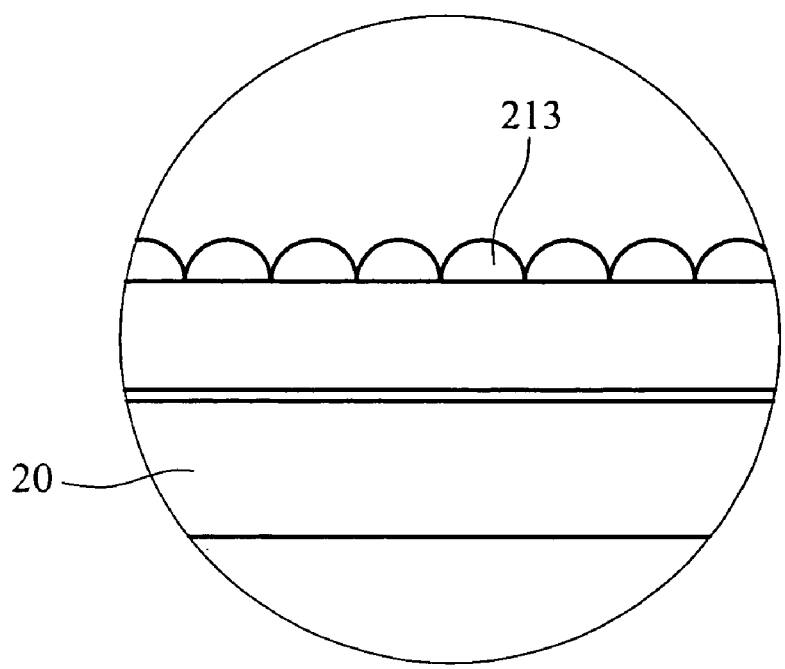
FIGS. 4A and 4B are fragmentary enlarged views according to FIG. 3.
Figure 4B:
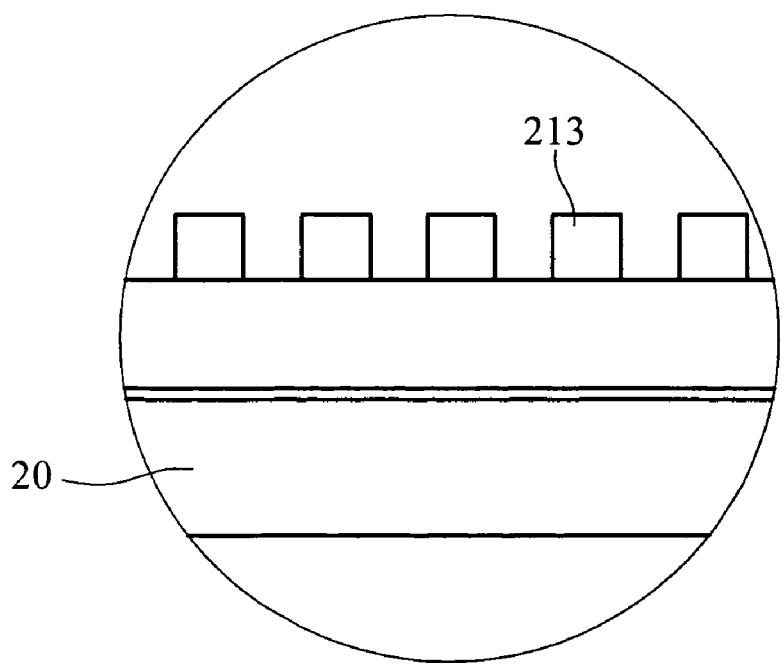

As the electronic equipment housed in the case is a heat-generating element, the case also should have a cooling function. Hence the shell and the blade-cooling portion are made of material of a high thermal conductive coefficient, such as aluminum, copper, silver, steel or the like. Besides using the material of a high thermal conductive coefficient, the cooling efficiency may also be enhanced by increasing the surface area of the blade-cooling portion 21. This may be accomplished by distributing a plurality of bosses 213 on the surface of the blade-cooling portion 21 as shown in FIG. 3. In order to have a firm support between the blade cooling portion and the elements, the contact area between the blade-cooling portion 21 and the elements do not have bosses 213. Referring to FIGS. 4A and 4B, the bosses 213 may be formed in a square or an arched shape.

Figure 5A:
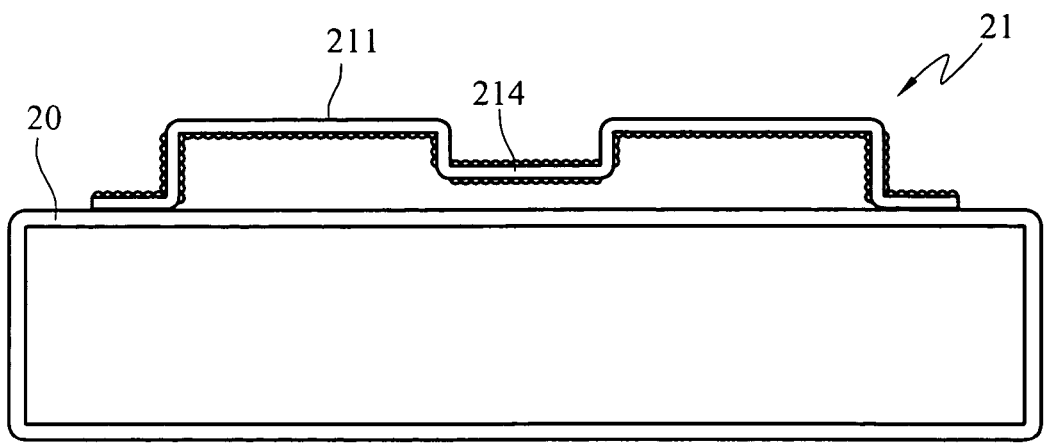
FIGS. 5A, 5B and 5C are schematic views of a third embodiment of the invention.
Figure 5B:
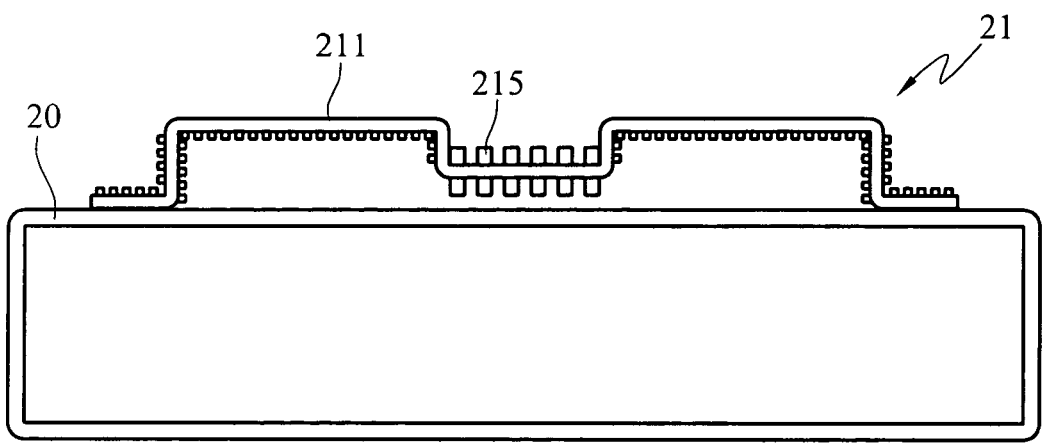
Figure 5C:
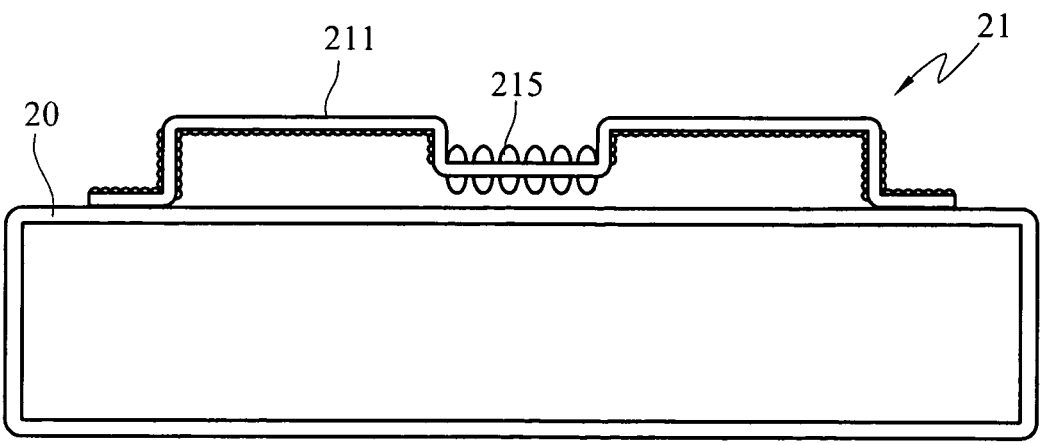

Refer to FIGS. 5A, 5B and 5C for another embodiment of the blade cooling portion 21. There is a cooling recess 214 located between two protrusive sections 211. The cooling recess 214 is not connected to any element, and aims to increase the radiation surface area and provides only cooling function, such as the one shown in FIG. 5A. To further increase the radiation surface area, the surface of this embodiment also may have a plurality of bosses 213 that are formed in the same shape of a square or an arch as shown in FIGS. 4A and 4B. In addition, the cooling recess 214 may also have a plurality of sub-protrusive sections 215 formed in a square or arched shape to increase the surface area as shown in FIGS. 5B and 5C.

Figure 6:
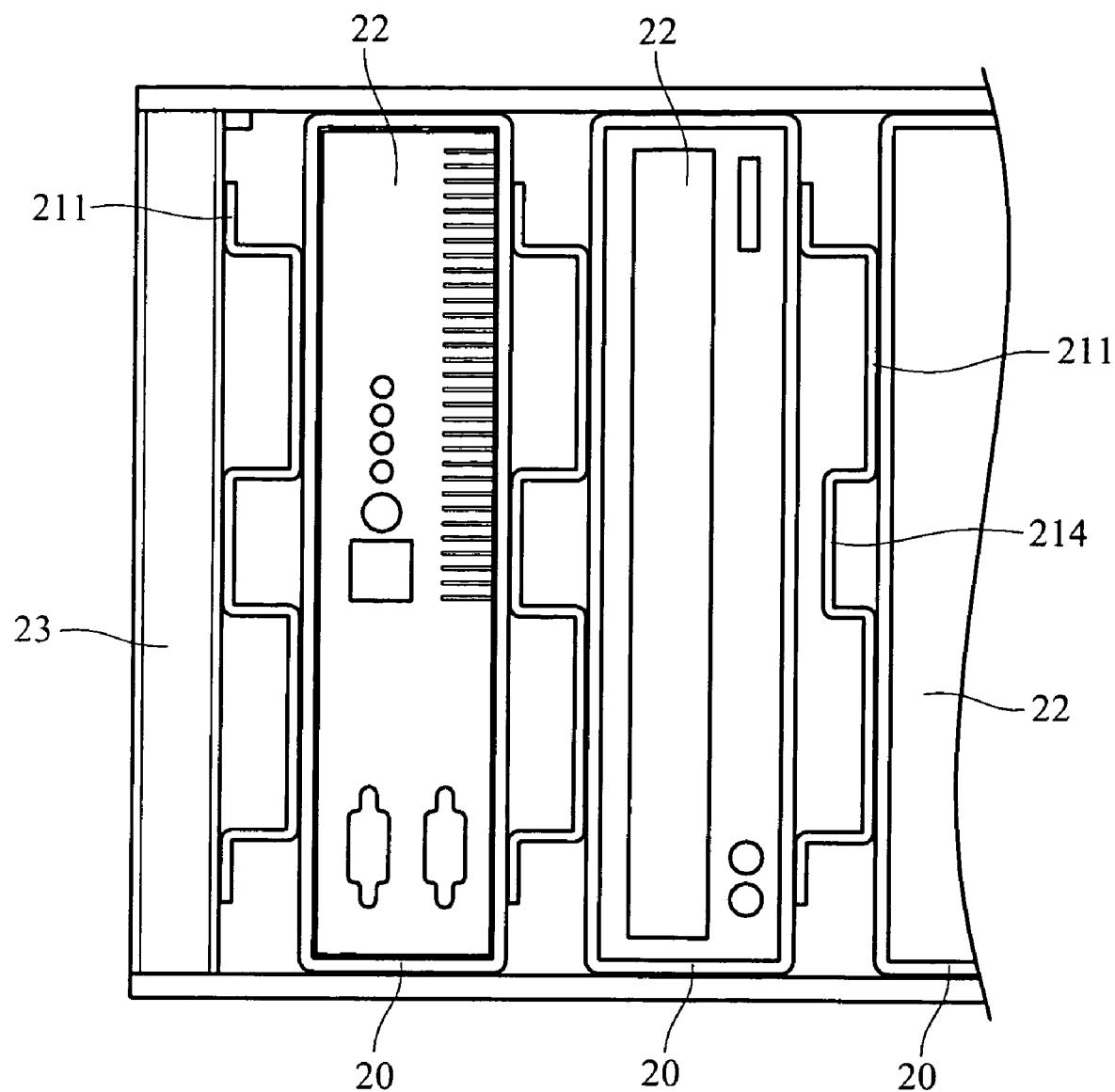
FIG. 6 is a schematic view of the invention in a use condition.

Refer to FIG. 6 for the invention in a use condition. A computer case 23 includes two electronic equipment parts 22 that are housed respectively in the shells of the invention. While the electronic equipment is operating, they generate heat. To prevent the heat from accumulating, the two electronic equipment parts 22 must be spaced from each other at a selected distance to facilitate heat dissipation. The two electronic equipment parts 22 thus spaced cannot be fastened firmly in the computer case 23, thus shaking and swaying occur. The electronic equipment case structure of the invention aims to couple the electronic equipment 22 in the case and fasten them to the computer case firmly with a limited space interval. With the case structure of the invention made of material of a high thermal conductive coefficient, and the bosses 213 formed on the surface to increase the surface area, the radiation area increases and the cooling efficiency improves. As the electronic equipment 22 and the computer case 23 also need a space interval between them to disperse heat, the case structure of the invention may also be used on the electronic equipment 22, to support the electronic equipment 22 and the computer case 23, and provide cooling.

By means of the design of the invention, elements may be braced firmly during assembly time and also be equipped with a cooling system. In addition, the protrusive sections of the blade cooling portion are spaced from one another at a selected distance, and can support other elements and the blade cooling portion is fixedly mounted onto the shell, hence the protrusive section can function as a buffer element to absorb impact when the computer is subject to a great external force. This further increases its practicality and added value.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. An electronic equipment case structure, comprising:
   a hollow shell which has a housing compartment to hold an electronic equipment; and
   a blade cooling portion which is fixedly mounted onto the surface of the shell and has a plurality of protrusive sections that are spaced from one another at a selected distance, and also are spaced from the shell at another selected distance.

2. The electronic equipment case structure of claim 1, wherein the blade cooling portion has a plurality of bosses on the surface thereof, the bosses being absent from the top surface of the protrusive sections and the bottom surface of the blade cooling portion.

3. The electronic equipment case structure of claim 2, wherein the bosses have a cross section of a square.

4. The electronic equipment case structure of claim 2, wherein the bosses have a cross section of an arched shape.

5. The electronic equipment case structure of claim 1, wherein two neighboring protrusive sections are interposed by a cooling recess which is located between the bottom surface and the top surface of the blade cooling portion.

6. The electronic equipment case structure of claim 5, wherein the cooling recess has a plurality of sub-protrusive sections.

7. The electronic equipment case structure of claim 6, wherein the sub-protrusive sections have a cross section of a square.

8. The electronic equipment case structure of claim 6, wherein the sub-protrusive sections have a cross section of an arched shape.

9. The electronic equipment case structure of claim 5, wherein the cooling recess has a plurality of bosses.

10. The electronic equipment case structure of claim 9, wherein the bosses have a cross section of a square.

11. The electronic equipment case structure of claim 9, wherein the bosses have a cross section of an arched shape.

12. The electronic equipment case structure of claim 1, wherein the shell and the blade cooling portions are made of material of a high thermal conductive coefficient.

13. The electronic equipment case structure of claim 12, wherein the material of a high thermal conductive coefficient is aluminum.

14. The electronic equipment case structure of claim 12, wherein the material of a high thermal conductive coefficient is steel.

15. The electronic equipment case structure of claim 12, wherein the material of a high thermal conductive coefficient is silver.

16. The electronic equipment case structure of claim 12, wherein the material of a high thermal conductive coefficient is copper.

* * * * *